(12) United States Patent
Shim et al.

(10) Patent No.: US 6,651,817 B2
(45) Date of Patent: Nov. 25, 2003

(54) TEST TRAY INSERT OF TEST HANDLER

(75) Inventors: Jae-Gyun Shim, Suwon (KR); Seung-Won Jeon, Suwon (KR); Yun-Sung Na, Cheonan (KR); In-Gu Jeon, Seoul (KR)

(73) Assignee: Techwing Co., Ltd. (KR)

( * ) Notice: Subject to any disclaimer, the term of this patent is extended or adjusted under 35 U.S.C. 154(b) by 50 days.

(21) Appl. No.: 09/981,486

(22) Filed: Oct. 17, 2001

(65) Prior Publication Data

US 2002/0070144 A1 Jun. 13, 2002

(30) Foreign Application Priority Data

Oct. 18, 2000 (KR) ................... 10-2000-0061445

(51) Int. Cl.⁷ ............................................... B65D 85/30
(52) U.S. Cl. ................ 206/726; 206/722; 206/560
(58) Field of Search ............................ 206/560, 722, 206/724, 725, 726, 728; 361/809

(56) References Cited

U.S. PATENT DOCUMENTS

| | | | | |
|---|---|---|---|---|
| 4,535,887 A | * | 8/1985 | Egawa | 206/721 |
| 5,291,994 A | * | 3/1994 | Murphy | 206/724 |
| 5,373,938 A | * | 12/1994 | Kubo | 206/701 |
| 5,573,427 A | * | 11/1996 | Sagano | 439/526 |
| 5,593,040 A | * | 1/1997 | Shelton et al. | 206/706 |
| 5,727,688 A | * | 3/1998 | Ishii et al. | 206/724 |
| 5,742,487 A | * | 4/1998 | Kobayashi et al. | 361/809 |
| 5,971,156 A | * | 10/1999 | Slocum et al. | 206/724 |
| 6,182,829 B1 | * | 2/2001 | Clark et al. | 206/719 |

* cited by examiner

*Primary Examiner*—David T. Fidei
(74) *Attorney, Agent, or Firm*—Cantor Colburn LLP

(57) ABSTRACT

A test tray insert of a test handler is provided including a housing, a locker, and a stopper, where one end side of the stopper is hinged on the inside of the mounting hole and the other end side of the stopper is protruded to the receiving hole so that the stopper fixes the device. The housing includes a receiving hole for loading a device in the enter of the receiving hole, and a mounting hole, extended from both sides of the receiving hole, including a joint jaw. The housing further includes a base protrusion placed n both ends of the bottom of the receiving hole and a supporting protrusion placed in both sides of the base protrusion.

6 Claims, 9 Drawing Sheets

TEST TRAY INSERT OF TEST HANDLER

CROSS REFERENCE

This application claims the benefit of Korean Patent Application No. 2000-61445, filed on Oct. 18, 2000, under 35 U.S.C. §119, the entirety of which is hereby incorporated by reference.

BACKGROUND OF THE INVENTION

1. Field of the Invention

The present invention refers to a test tray insert, and more particularly, to a test tray insert of a test handler for loading conveniently a device to a correct position without the device separation from the insert, even when the insert moves, and for unloading the device from the insert, too.

2. Description of the Related Art

An electric component (in this application, a 'device' is designated for an electric component in the following statements) such as an integrated circuit (IC) or a semiconductor chip, manufactured through a predetermined assembly process in a semiconductor manufacturing process, should perform a test process for checking whether a predetermined function in the device is operated or not. A test handler is employed in such a test process, and the test process is accomplished by transferring a predetermined number of the devices and by contacting a test head to the devices. According to the test results, the devices are classified and transferred.

Such a test handler transfers the 32 or 64 devices to the test head for testing simultaneously, and performs a test in the specified temperature surroundings, such as the high or the low temperature.

In other words, as illustrated in FIG. 1 and FIG. 2, a transfer arm sequentially transfers a user tray loaded in a user tray supplier 10 to a loading side set plate 30. A orthogonal loading robot 90 picks up the devices in the user tray placed in the loading side set plate 30, and transfers the devices to a test tray 70 placed in a first tray arranging station 80.

The test tray is circulated through the first tray arranging station 80, a soak chamber 50, two test chambers, a de-soak chamber 60, a third tray arranging station 82 and a second tray arranging station 81 sequentially.

The soak chamber 50 heats up or cools down the devices in the test tray 70 to a desired test temperature, and lifts down the test tray 70 to supply the test tray 70 to the test chamber. The test chamber maintains constant temperature environments, and performs tests by connecting the devices to test heads 100 and 101. A first test chamber performs tests for 32 devices and a second test chamber tests for other 32 devices.

The de-soak chamber 60 recovers the heated or the cooled temperature of the devices to a room temperature, and lifts up the test tray 70 to supply the test tray 70 to the third tray arranging station 82. In next, the tested devices are unloaded to the user tray classified in the test tray and discharged through a user tray deliver 20.

A plurality of inserts are fixed on the test tray for placing the devices to correct positions on the test tray and for preventing the devices deviation from the test tray while the devices are circulated inside of the test handler when the above described tests procedure is performed.

The conventional insert, as illustrated in FIG. 3, includes a device receiver 110 and a device cover 140, which are different gadgets between each other. The device receiver 110 comprises a device site 112 in the center of the main body 101 for receiving a device 160. A first guide bush 114 and a second guide bush 116, both guide bushes are cylindrical shape, are inserted to the main body 101 of the device receiver 110 to correctly guide and arrange the insert 100 with the test head when the insert 100 contacts to the test head.

The device cover 140 closes the device site 112 when the device 160 is inserted to the device site 112 of the device receiver 110 and keeps the device 160 safely. The device cover 140 comprises a housing of a cover main body 141, a pair of hinges 142, a connector 143, and a pair of rotator 144.

The main body 101 includes a hinge receiving opener 119 for receiving the pair of hinges 142 of the device cover 140. In more, a coupling pin 104 is inserted into a first penetration hole 102 and a second penetration hole 106 formed in the hinge 142 of the device cover 140 when the device receiver 110 and the device cover 140 are connected between them. In this case, a torsion coil spring 120 is inserted into the first penetration hole 102 so that the device cover 140 can rotate only to the upward direction of the center of the coupling pin 104.

Therefore, when the device 160 is placed on the device site 112 of the device receiver 110 while the device cover 140 is open, and a closing plate 146 of the device cover 140 is connected to a locking ring 118 of the device receiver 110, the device 160 is fixed within the device receiver 110. As a result, the device 160 can not be apart from the insert while moving the device 160 for tests of characteristic and performance.

However, such a structure of the insert is so complicated that the production cost for the insert is expensive and the productivity for the insert is low because the assembly time is long. Additionally, the structure of the insert is inconvenient in that the device cover 140 should be opened and closed whenever the device 160 is loaded and unloaded.

SUMMARY OF THE INVENTION

To overcome the above described problems, preferred embodiments of the present invention provide a test tray insert of a test handler that is simple in the structure and the shape, while fixed to the correct position of the insert, and that loads and unloads conveniently devices.

In order to achieve the above object, the preferred embodiment of the present invention provides a test tray insert of a test handler comprising a housing, a locker, and a stopper, wherein one end side of the stopper is hinged on the inside of the mounting hole and the other end side of the stopper is protruded to the receiving hole so that the stopper fixes the device. The housing includes a receiving hole for loading a device in the center of the receiving hole, and a mounting hole, extended from both sides of the receiving hole, including a joint jaw. The locker inserted in the mounting hole of the housing, moves up and down. The stopper is placed in the bottom side of the locker.

According to the present invention, the housing comprises a base protrusion placed in both ends of the bottom of a receiving hole, for upholding the bottom of the device, and a supporting protrusion placed in both sides of the base protrusion, for supporting the both sides of the device, wherein the mounting hole includes a penetration hole in the bottom side and a suspending protrusion in the upper side and a compressed spring is mounted between the upper side of the locker and the suspending protrusion, so that the locker is pushed to the downward direction.

According to the present invention, the housing comprises a site fixing hole built in both end sides of the housing, and a bush with a screw unit in the inner diameter built in one side of the site fixing hole.

According to the present invention, a predetermined portion of the bush is protruded to the outside of the bottom of the housing.

According to the present invention, the locker comprises the both sides of the locker inserted into the mounting hole, the center of the locker protruded from the joint jaw to the direction of the receiving hole, and the both sides of the bottom of the locker including a predetermined length of a protruded lead unit.

According to the present invention, the stopper comprises a horizontal surface, and a vertical surface built in the downward direction from the both ends of the horizontal surface, wherein the one end of the vertical surface inludes a hinge hole combining with the penetration hole of the housing by a joint pin so that the stopper can rotate.

According to the present invention, the upper side of the horizontal surface includes a suspending jaw for suspending on the bottom center of the locker to prevent the stopper from rotating in the center of the joint pin, and the stopper rotates after the locker is raised up and the bottom center of the stopper is released from the suspending jaw.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

Reference will now be made in detail to preferred embodiments of the present invention, example of which is illustrated in the accompanying drawings.

Figure 1:
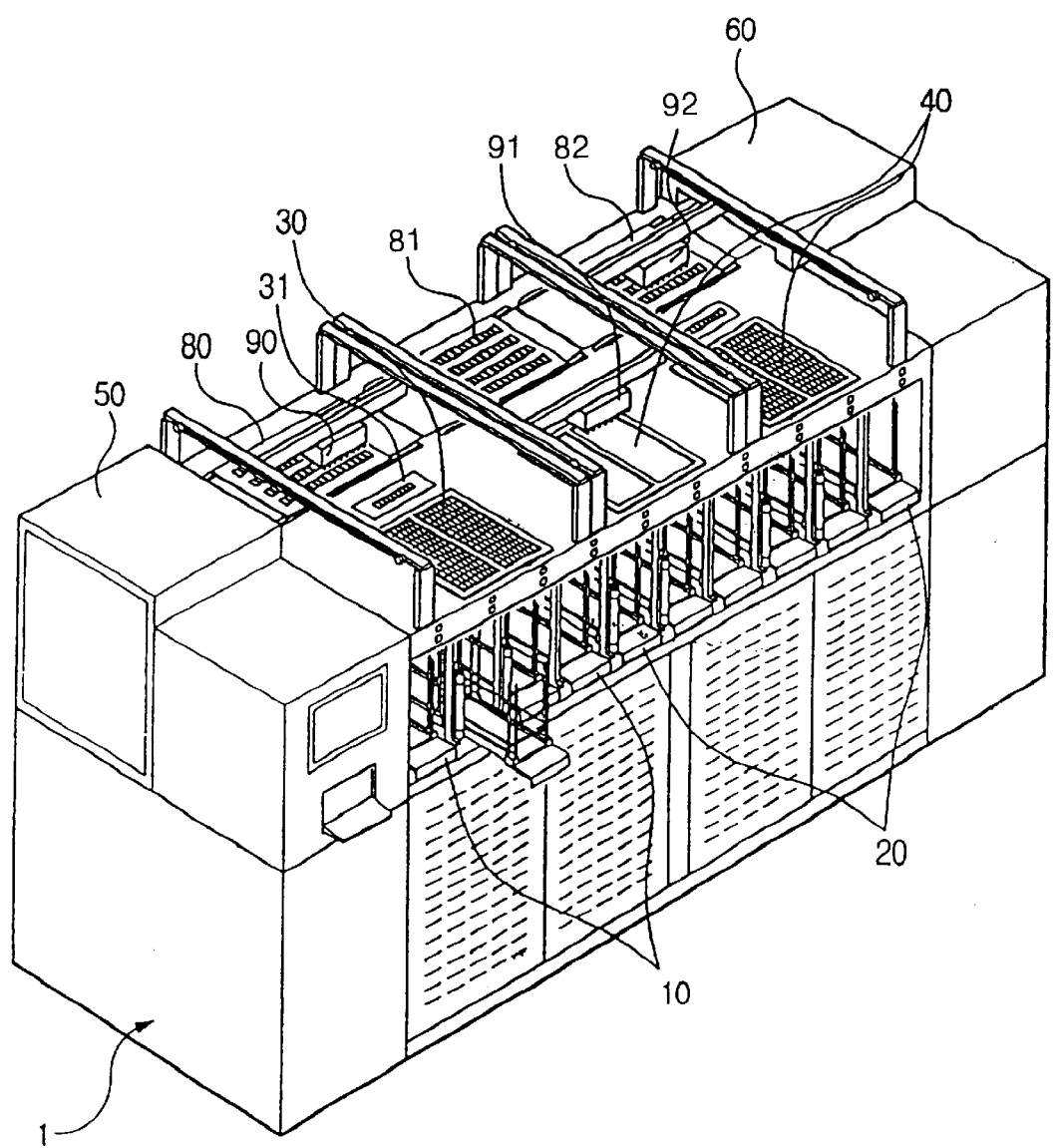
FIG. 1 is a perspective view showing a conventional test handler.
Figure 2:
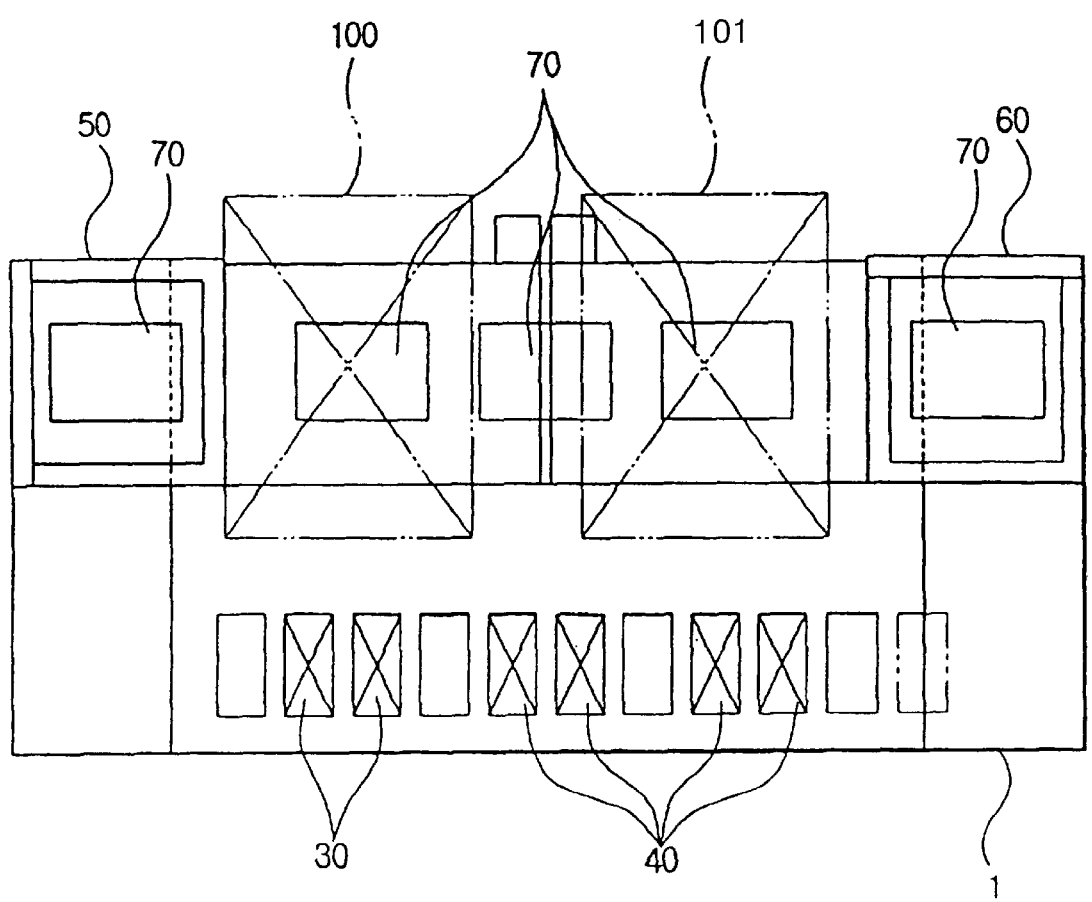
FIG. 2 is a plane view illustrating functions of the conventional test handler.
Figure 3:
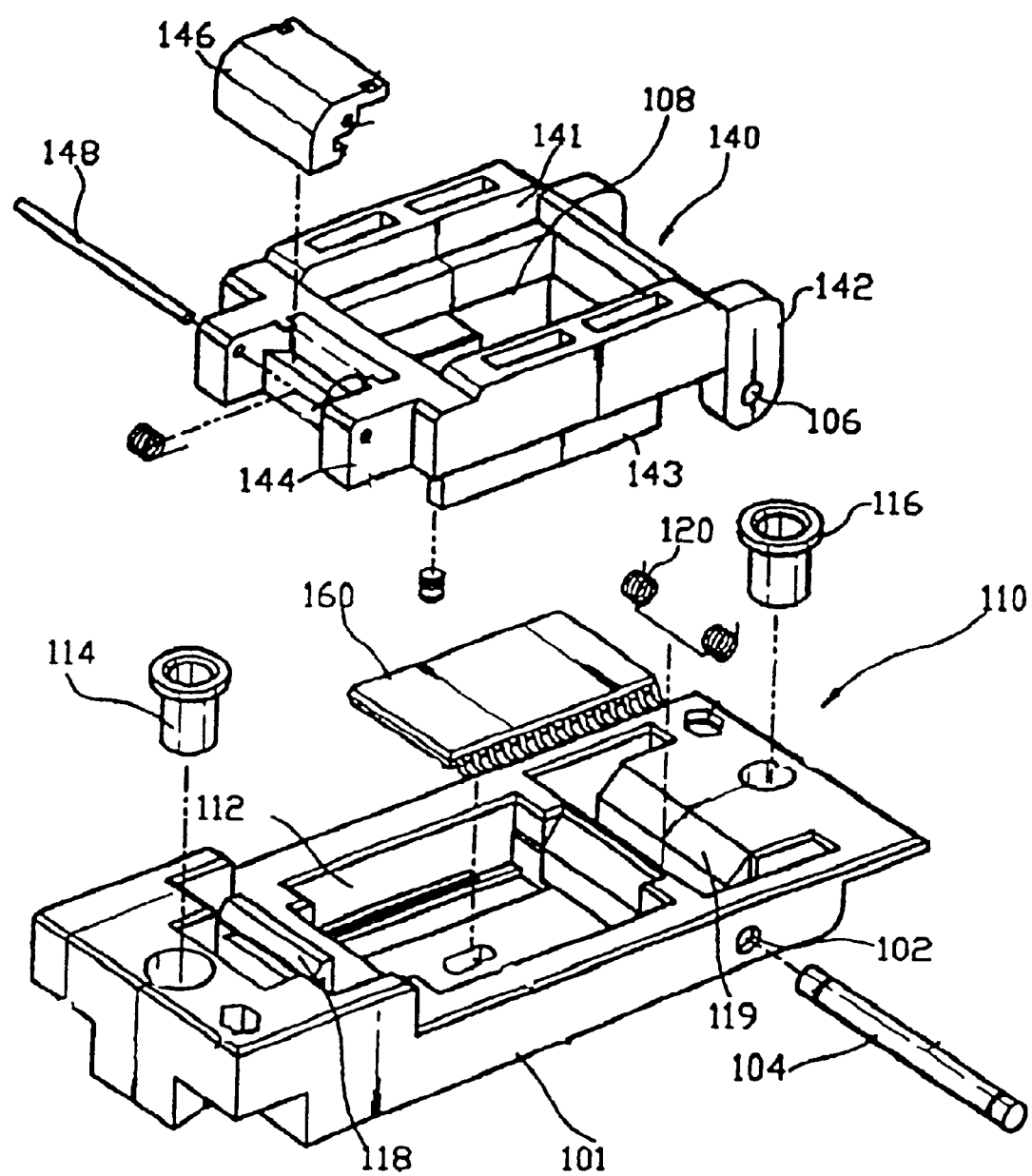
FIG. 3 is a disassembled perspective view showing a conventional insert.
Figure 4:
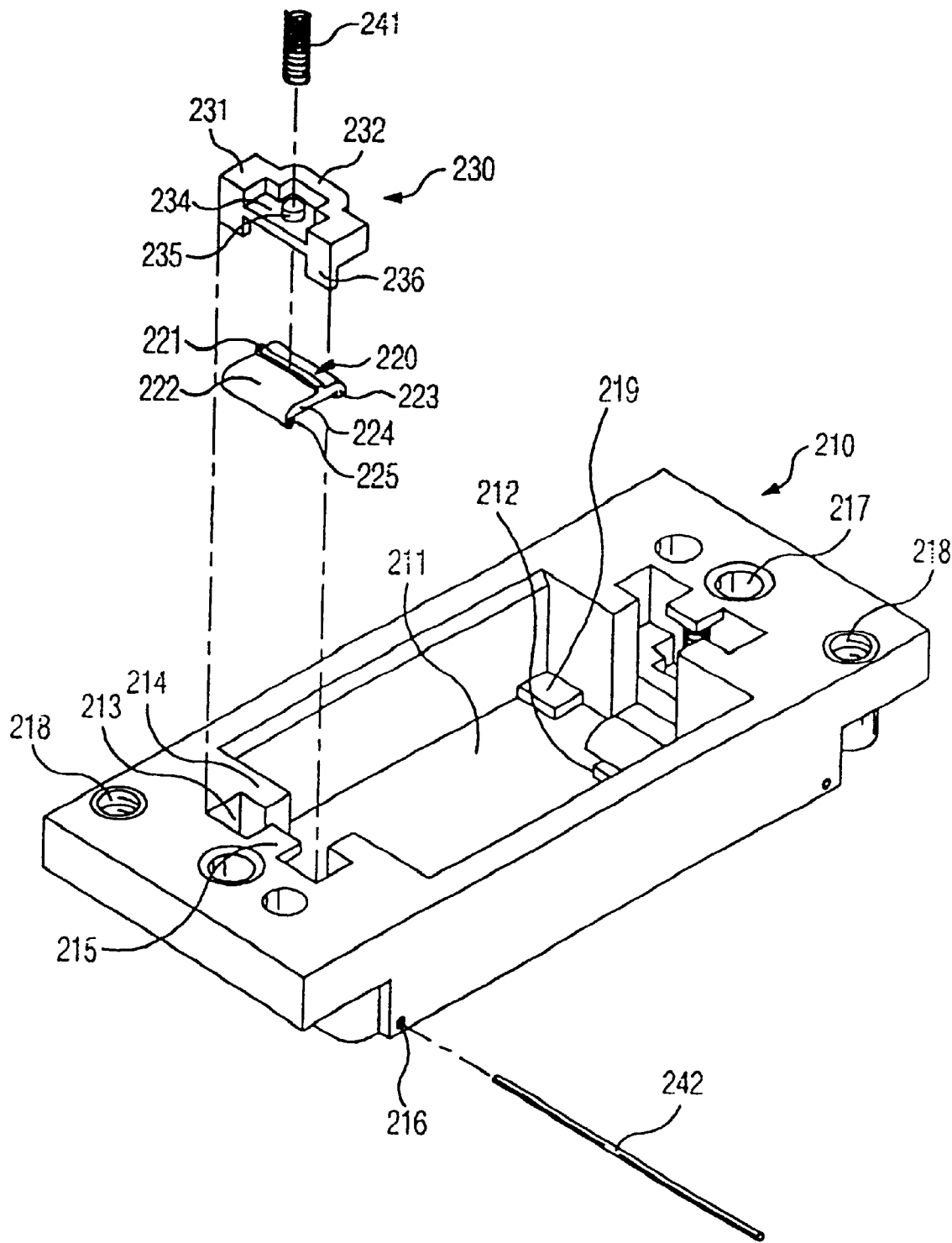
FIG. 4 is a disassemble perspective view showing an insert according to a preferred embodiment of the present invention.

FIG. 4 is a disassemble perspective view showing an insert according to the preferred embodiment of the present invention. In more, FIG. 5 is a cross sectional view showing an inner structure of the insert according to the preferred embodiment of the present invention.

Figure 5:
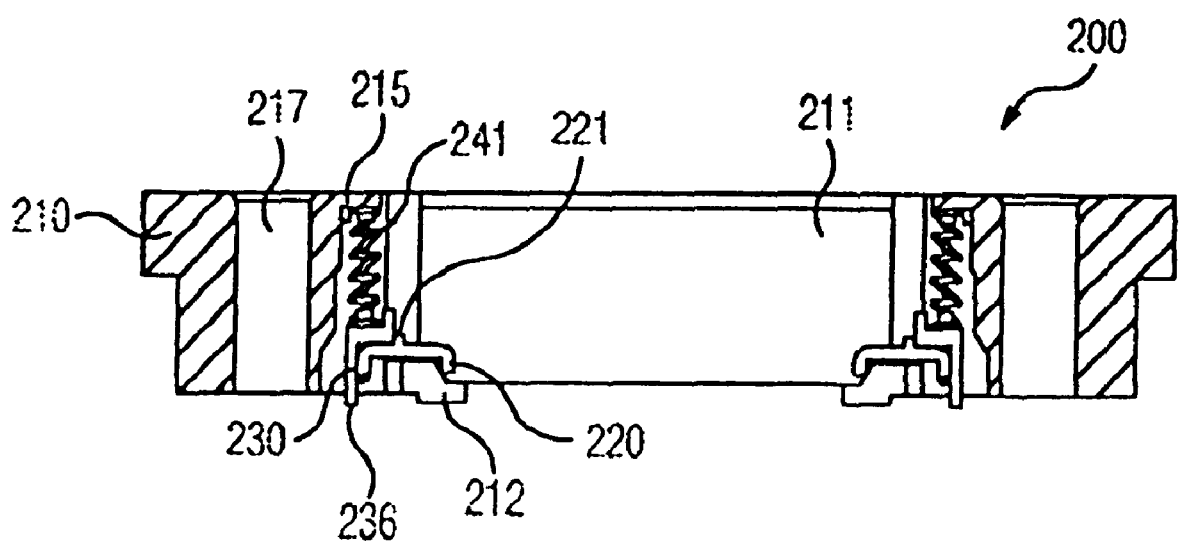
FIG. 5 is a cross sectional view showing the inner structure of an insert according to the preferred embodiment of the present invention.

As shown in FIG. 4 and FIG. 5, an insert 200 comprises a housing 210 receiving a device 201 (not shown), stopper 220 fixing the device in the both end sides of the housing 210, a locker 230 and a compression spring 241.

The housing 210 includes a receiving hole 211 for loading the device, a base protrusion 212, placed in both ends of the bottom of the receiving hole 211, for upholding the bottom of the device, and a supporting protrusion 219 for supporting the both sides of the device. In more, a mounting hole 213 is built in both sides of the receiving hole 211 to insert the stopper 220 and the locker 230, wherein the stopper 220 and the locker 230 move up and down. The mounting hole 213 protrudes a jointing jaw 214 while the one side of the mounting hole 213 is open to the receiving hole 211, and a suspending protrusion 215 is placed in the upper side of the mounting hole 213 to suspend the locker 230. Additionally, a penetration hole 216 is built in the bottom side of the mounting hole to combine with the one side of the stopper 220.

In more, a site fixing hole 217 is built in both ends of the housing 210 and in the center of the insert 200 to insert a site fixing pin for fixing the position of the insert 200. A bush 218 having a screw unit in the inner diameter is also inserted into the housing 210 besides the site fixing hole 217. The bush 218 jointing in screw with the insert 200 to the test tray 202, is inserted into the partially narrow step area in the both ends of the housing 210 and the one side of the bush 218 is protruded to the outside of the housing 210.

The stopper 220 inserted into inside of the mounting hole 213 in the housing 210, includes a horizontal surface 222 having a suspending jaw 221 in the upper side, and vertical surfaces 223 and 224 built in vertical downward direction from the both end sides of the horizontal surfaces 222. A joint pin 242 fixes a hinge hole 225 built in the one side of the vertical surface 224, after the hinge hole 225 stands in line with the penetration hole 216 of the mounting hole 213 in the housing 210. In this case, the diameter of the penetration hole 216 is a little smaller than that of the joint pin 242 so that the penetration hole 216 is compressed with the joint pin 242. However, the diameter of the hinge hole 225 is larger than that of the joint pin 242 so that the hinge hole 225 can be rotated in free.

The both sides 231 of the locker 230 are inserted into the mounting hole 213 so that the locker 230 is suspended to the joint jaw 214, and a center 232 of the locker 230 is protruded to the direction of the receiving hole 211 in the position of the joint jaw 214. A fixing groove 234 and a fixing protrusion 235 are built in the upper side of the locker 230 to fix the compression spring 241 and a leader 236 is protruded from the bottom side of the both sides 231 of the locker to smoothly move up and down in the mounting hole 213.

Therefore, the joint pin 242 fixes the stopper 220 inserted into the bottom side of the penetration hole 213 in the housing 210 to rotate the stopper in free, and the locker 230 is inserted into the upper side of the stopper 220. In more, the compression spring 241 is mounted between the fixing groove 234 of the locker 230 and the suspending protrusion 215 of the housing 210. Therefore, the locker 230 presses the stopper 220 because the restoring force of the compression spring 241 is transferred to the downward direction.

In this case, the bottom side of the center 232 of the locker 230 is inserted into the suspending jaw 221 of the stopper 220 so that the locker 230 prevents the rotation of the stopper 220. Therefore, the stopper 220 can not be rotated and pressed continuously to the downward direction until the locker 230 is removed.

Referring to the accompanying drawings, the preferred embodiment of operations according to the present invention will be illustrated in more detail.

Figure 6:
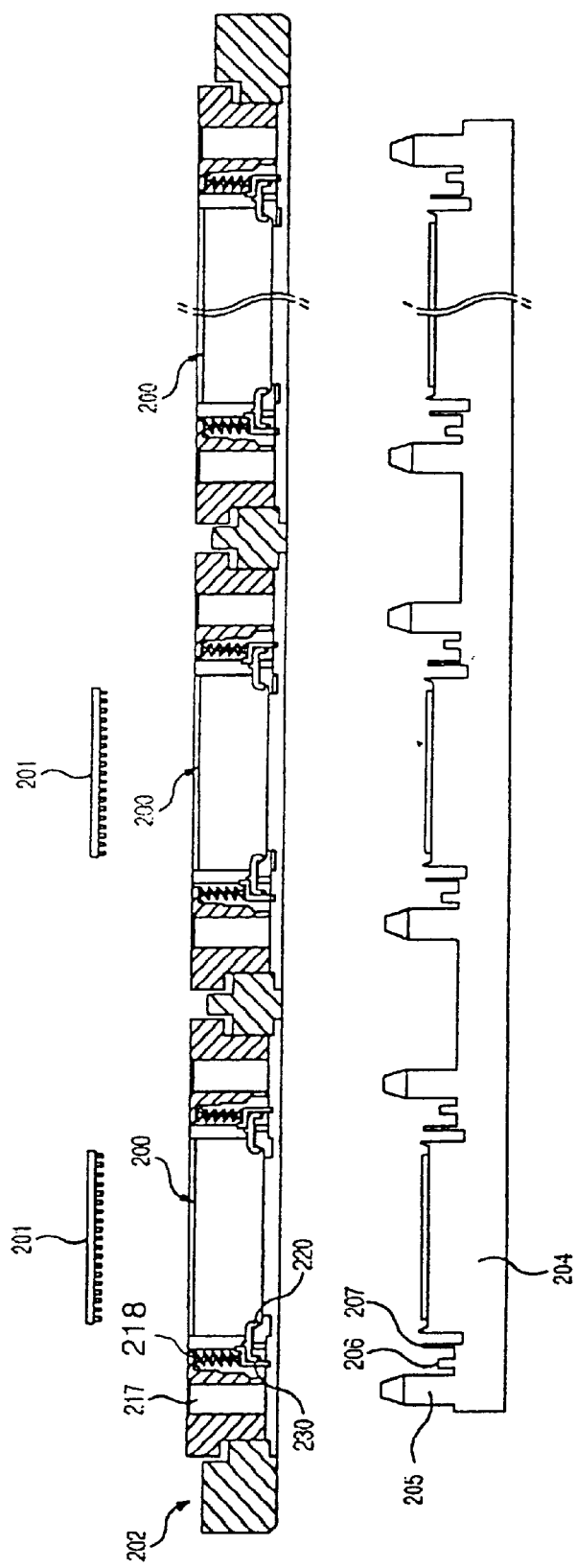
FIG. 6 is a cross sectional view showing inserting a site decision unit to the insert according to the preferred embodiment of the present invention.
Figure 7:
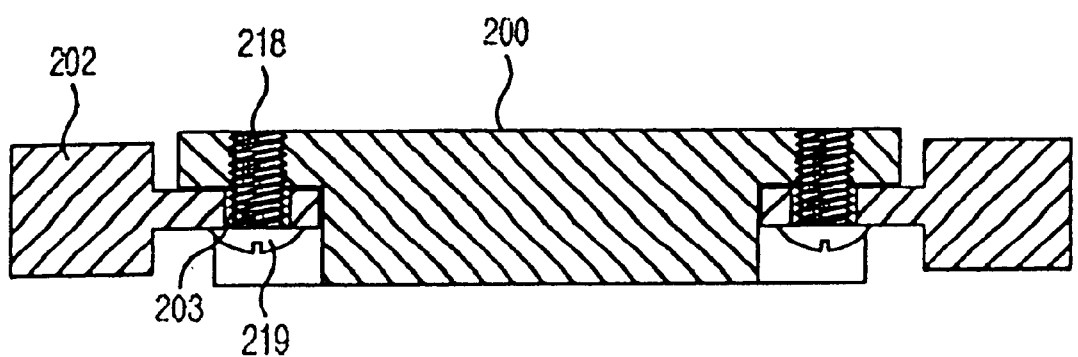
FIG. 7 is a cross sectional view showing connecting the insert to a test tray according to the preferred embodiment of the present invention.
Figure 8:
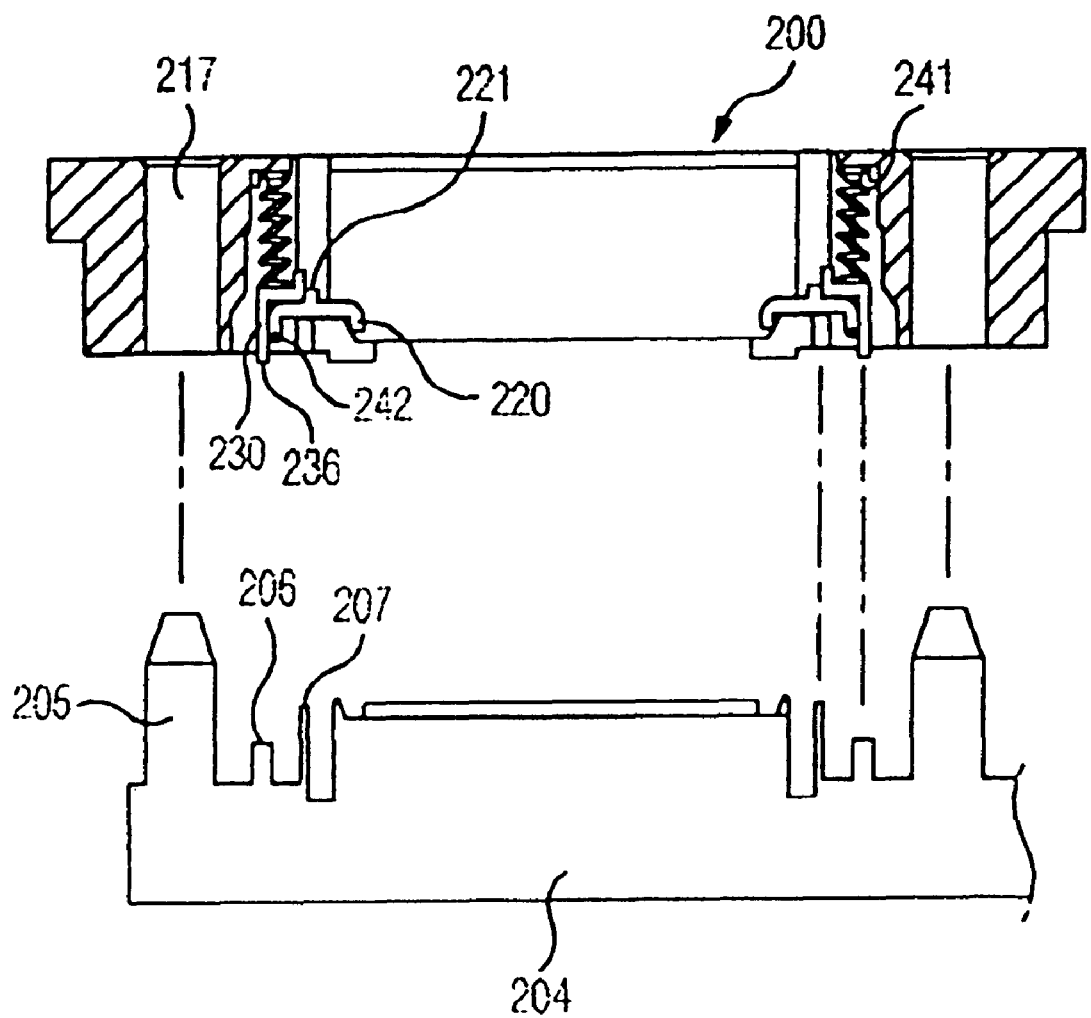
FIG. 8 is a magnified view showing inserting the insert to the site decision unit according to the preferred embodiment of the present invention.

FIG. 6 is a cross sectional view showing inserting a site decision unit to the insert according to a preferred embodiment of the present invention. FIG. 7 is a cross sectional view showing connecting the insert to a test tray according to the preferred embodiment of the present invention. FIG. 8 is a magnified view showing inserting the insert to the site decision unit according to the preferred embodiment of the present invention, In more, FIG. 9 is a diagram showing operation states of the insert according to the preferred embodiment of the present invention.

As shown in FIG. 6 and FIG. 7, the bush 218 of the insert 200 is jointed to the test tray 202 in bolts so that the insert 200 is fixed to the test tray 202 in movable states. In other words, the bush 218 of the insert 200 has a relatively smaller diameter than a floating hole 203 on the test tray 202. After the bush 218 is inserted into the floating hole 203, a bolt joints the bottom of the bush 218 so that the bolt prevents the deviation of the insert 200 and makes the insert 200 float as amount as the margin of the diameter of the floating hole 203.

Figure 9:
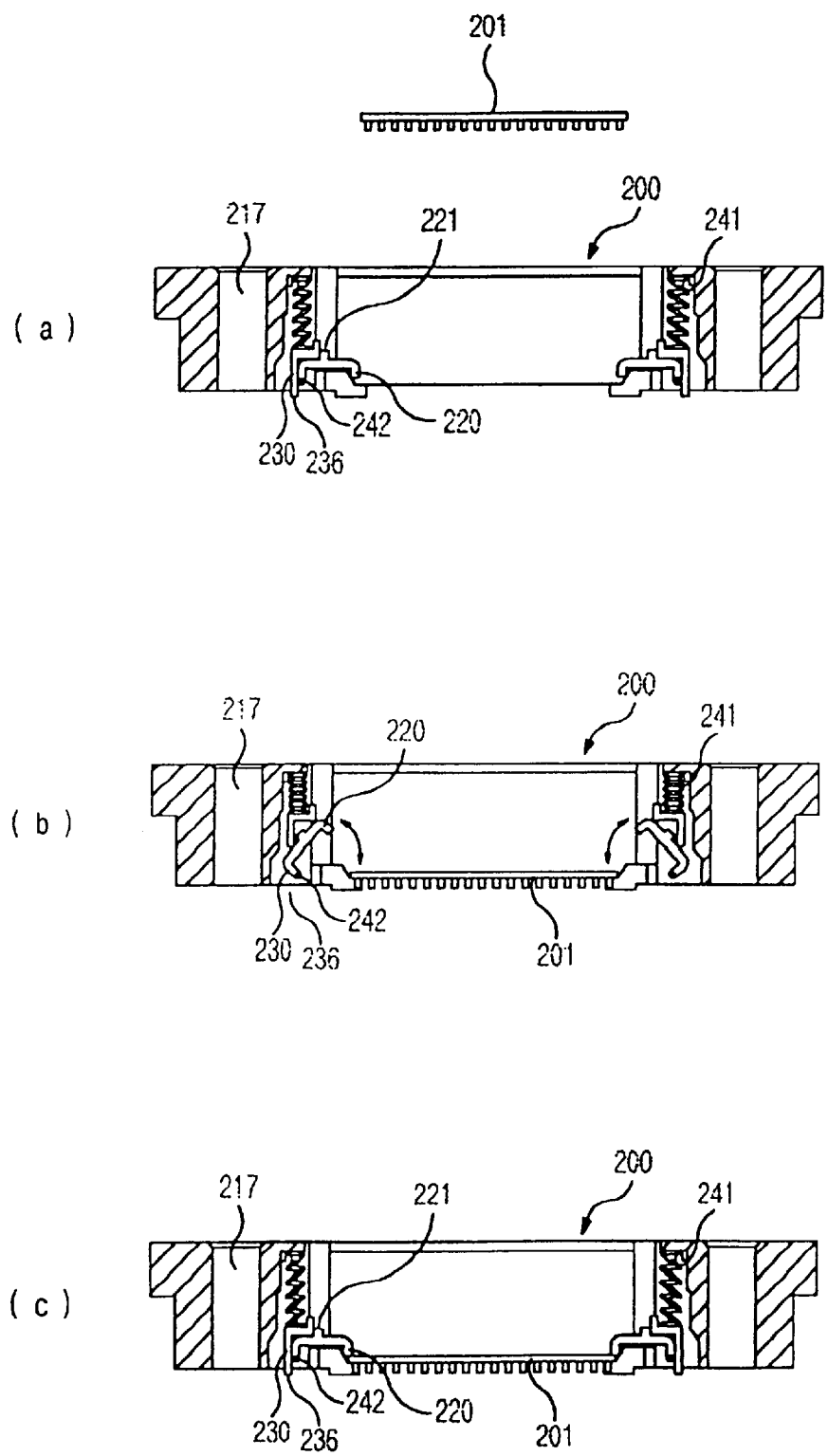
FIG. 9 is a diagram showing operation states of the insert according to the preferred embodiment of the present invention.

Additionally, as shown in FIG. 8 and FIG. 9, when the device 201 is loaded to the insert 200 of the test tray 300, a site decision unit 204 installed in the bottom side of the test tray 202 is raised up to fix the insert 200. In other words, a site decision pin 205 is inserted into the site fixing hole 217 of the housing 210 in the insert 200 to place the insert 200 correctly while the insert 200 moves on the test tray 202. After that, a locker pin 206 of the site decision unit 204 pushes the leader 236 of the locker 230 to raise up the center 232 (shown in FIG. 4) of the locker 230 suspended in the suspending jaw 221, and thereby, to unlock the stopper 220. In more, a stopper pin 207 of the site decision unit 204 pushes up the bottom side of the stopper 220. Therefore, the stopper 220 is raised up while the stopper 220 is rotated as the rotation center is the hinge point, the joint pin 242.

In this states, the device 201 is loaded to the receiving hole 211 of the insert 200 and mounted to the base protrusion 212 and the supporting protrusion 219 of the housing 210.

After loading the device, when the site decision unit 204 moves to the downward direction, the locker pin 206 and the stopper pin 207 also move to the downward direction. In more, the compression spring 241 equipped in the insert 200 pushes the locker 230 to the downward direction, and also pushes the stopper 220 so that the stopper 220 is raised down while the stopper is rotated as the rotation center is the hinge point. Therefore, the vertical surface 223 (shown in FIG. 4) of the stopper 220 pushes the device so that the restored force of the compression spring 241 fixes the device to prevent the movement of the device 201, and the supporting protrusion 219 supports both sides of the device to prevent the rotation of the device.

In more, the bottom side of the center 232 of the locker 230 is suspended to the suspending jaw 221 of the stopper 220 to prevent the stopper 220 from moving to the upward direction. Therefore, the position of the device is not deviated even though the external force is supplied, and the device 201 is placed in the correct position while the device 201 is moved and tested.

Additionally, when the device is unloaded from the insert 200 after the tests are completed, the site decision unit 204 is raised up from the bottom of the test tray 201 fixing the insert 200 in the movable states, and inserted into the site decision pin 205 of the site fixing hole 217 in the housing 210. Therefore, the insert 200 is placed in the correct position. After that, the locker pin 206 of the site decision unit 204 pushes up the leader 236 of the locker 230 to raise up the center 232 of the locker 230 suspending the suspension jaw 221 of the stopper 220, and to unlock the stopper 220. In more, the stopper pin 207 of the site decision unit 204 pushes up the bottom side of the stopper 220 so that the stopper is rotated while the rotation center is the hinge point, and so that the stopper 220 is raised up. Therefore, when the fixing force to the device is removed, the device 201 is unfixed and picked up easily to be transferred.

Accordingly, the test tray insert of the test handler according to the present invention loads the devices in a correct position and fixes the devices without the device separation from the insert. Therefore, the device loading time is reduced because a pre-sizing operation is not necessary to load the devices. Additionally, the productivity is improved because the error ratio is enormously lowered when the device contact to the test head.

In more, the lock between the device and the insert is hardly unlocked by the external impacts, even though the device is easily locked and unlocked to the insert when the device is loaded to or unloaded from the insert.

In more, the insert is simple in the structure and the shape so that the time and the expenses for manufacturing and assembling the insert can be reduced.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A test tray insert of a test handler comprising:
   a housing including a receiving hole for loading a device in a center of the receiving hole and a mounting h le extended from both sides of the receiving hole, including a joint jaw;
   a locker inserted in the mounting hole of the housing, moving up and down;
   a stopper placed in a bottom side of the locker, wherein one end side of the stopper is hinged on an inside of the mounting hole and the other end side of the stopper is protruded to the receiving hole so that the stopper fixes the device;
   wherein the housing comprises:
     a base protrusion place in both ends of the bottom of the receiving hole, for upholding both end sides of a bottom of the device; and
     a supporting protrusion placed in both sides of the base protrusion, for supporting the both sides of the device;
   wherein, the mounting hole includes a penetration hole in the bottom side and a suspending protrusion in the upper side and a compression spring is mounted between an uper side of the locker and the suspending protrusion, so that the locker is pushed to the downward direction.

2. The test tray insert according to claim 1, wherein the housing comprises:
   a site fixing hole built in both end sides of the housing; and a bush with a screw unit in the inner diameter built in one side of the site fixing hole.

3. The test tray insert according to claim 2, wherein a predetermined portion of the bush is protruded to the outside of the bottom of the housing.

4. The test tray insert according to claim 1, wherein the locker comprises:

both sides of the locker inserted into the mounting hole;

a center of the locker protruded from the joint jaw to the direction of the receiving hole; and the both sides of the bottom of the locker including a predetermined length of a protruded lead unit.

5. The test tray insert according to claim 1, wherein the stopper comprises:

a horizontal surface; and a vertical surface built in the downward direction from the-both ends of the horizontal surface, wherein, one end of the vertical surface includes a hinge hole combining with a penetration hole of the housing by a joint pin so that the stopper can be rotated.

6. The test tray insert according to claim 5, wherein the upper side of the horizontal surface includes a suspending jaw for suspending on a bottom center of the locker to prevent the stopper from rotating in a center of the joint pin, and the stopper rotates after the locker is raised up and the bottom center of the stopper is released from the suspending jaw.

* * * * *